US007011420B2

(12) United States Patent
Cok

(10) Patent No.: US 7,011,420 B2
(45) Date of Patent: Mar. 14, 2006

(54) PLANAR DIRECTED LIGHT SOURCE

(75) Inventor: Ronald S. Cok, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 183 days.

(21) Appl. No.: 10/234,553

(22) Filed: Sep. 4, 2002

(65) Prior Publication Data

US 2004/0042198 A1   Mar. 4, 2004

(51) Int. Cl.
*F21V 9/16*   (2006.01)

(52) U.S. Cl. .................. 362/84; 362/244; 362/800; 362/333

(58) Field of Classification Search .................. 362/84, 362/244, 800, 226, 98, 330, 355, 333, 237, 362/331; 257/98; 313/504; 359/15
See application file for complete search history.

(56) References Cited

U.S. PATENT DOCUMENTS

| 6,168,282 | B1 | | 1/2001 | Chien |
| 6,337,381 | B1 | * | 1/2002 | Biebuyck et al. ............. 528/12 |
| 6,513,951 | B1 | * | 2/2003 | Wang et al. ................. 362/253 |
| 6,565,231 | B1 | * | 5/2003 | Cok ............................ 362/226 |
| 6,583,805 | B1 | * | 6/2003 | Mashimo et al. ........... 347/241 |
| 6,665,427 | B1 | * | 12/2003 | Keagy et al. ................ 382/124 |
| 6,703,780 | B1 | * | 3/2004 | Shiang et al. ................ 313/504 |
| 2002/0141006 | A1 | * | 10/2002 | Pocius et al. .................. 359/15 |

FOREIGN PATENT DOCUMENTS

| EP | 1 120 838 A2 | 8/2001 |
| WO | 99/57945 | 11/1999 |

* cited by examiner

*Primary Examiner*—Stephen Husar
*Assistant Examiner*—Guiyoung Lee
(74) *Attorney, Agent, or Firm*—Andrew J. Anderson

(57) ABSTRACT

A solid-state light source includes a planar substrate, a single unitary organic light emitting diode (OLED) layer deposited on the planar substrate, the organic light emitting diode layer including first and second electrodes for providing electrical power to the OLED layer, an encapsulating cover covering the OLED layer; first and second conductors electrically connected to the first and second electrodes, and extending beyond the encapsulating cover for making electrical contact to the first and second electrodes by an external power source; and a lenslet array located on the substrate and/or encapsulating cover and coextensive with the OLED layer for directing the light emitted by the OLED layer.

20 Claims, 5 Drawing Sheets

PLANAR DIRECTED LIGHT SOURCE

FIELD OF THE INVENTION

The present invention relates to the use of organic light emitting diodes for area illumination, and more particularly to directed area illumination such as is provided by a spotlight.

BACKGROUND OF THE INVENTION

The light emitting elements in conventional bulbs (the filament of an incandescent bulb or the fluorescent material in a fluorescent bulb) are extremely bright and emit light in every direction. In many applications, directed lighting is preferred, for example with spotlights, floodlights, or track lighting. For these applications, traditional lighting devices such as incandescent or fluorescent light bulbs typically require reflectors or lenses to direct the light output. For example, desk, table, floor and ceiling lamps conventionally use shades to reflect light to the ceiling or floor to provide indirect lighting suitable for use in a home or office environment. Spotlights or floodlights place the lighting element within a curved reflector to direct the light. Thick glass conventional lenses and fresnel lenses are often employed to both refractively direct the light emitted and to seal the lighting elements. These reflectors and lenses are expensive, may be heavy, and take considerable space.

Solid-state lighting devices made of light emitting diodes are increasingly useful for applications requiring robustness and long-life. For example, solid-state LEDs are found today in automotive applications. These devices are typically formed by combining multiple, small LED devices providing a point light source into a single module together with glass lenses or reflectors suitably designed to direct the light as is desired for a particular application; see for example, WO99/57945, published Nov. 11, 1999. These multiple devices are expensive and complex to manufacture and integrate into single illumination devices.

Organic light emitting diodes (OLEDs) are manufactured by depositing organic semiconductor materials between electrodes on a substrate. This process enables the creation of light sources having an extended light emitting surface area on a single substrate. The prior art describes the use of electro-luminescent materials as adjuncts to conventional lighting; see for example U.S. Pat. No. 6,168,282, issued Jan. 2, 2001 to Chien. In this case, because of the limited light output from the electro-luminescent material, it is not useful for primary lighting.

EP1120838A2, published Aug. 1, 2001 describes a method for mounting multiple organic light emitting devices on a mounting substrate to create a light source. However, the light source is not directed.

There is a need therefore for an improved OLED lighting apparatus for directed illumination having a simple construction that provides a highly integrated and robust light.

SUMMARY OF THE INVENTION

The need is met by providing a solid-state area illumination light source that includes a planar substrate, a non-pixellated organic light emitting diode (OLED) layer deposited on the planar substrate, the organic light emitting diode layer including first and second electrodes for providing electrical power to the OLED layer, an encapsulating cover covering the OLED layer; first and second conductors electrically connected to the first and second electrodes, and extending beyond the encapsulating cover for making electrical contact to the first and second electrodes by an external power source; and a lenslet array located on the substrate and/or encapsulating cover and coextensive with the OLED layer for directing the light emitted by the OLED layer.

ADVANTAGES

The present invention has the advantage of providing an inexpensive, long lived, highly efficient, lightweight, low volume directed light source that provides directed illumination in a small package.

It will be understood that the figures are not to scale since the individual layers are too thin and the thickness differences of various layers too great to permit depiction to scale.

DETAILED DESCRIPTION OF THE INVENTION

Figure 1:
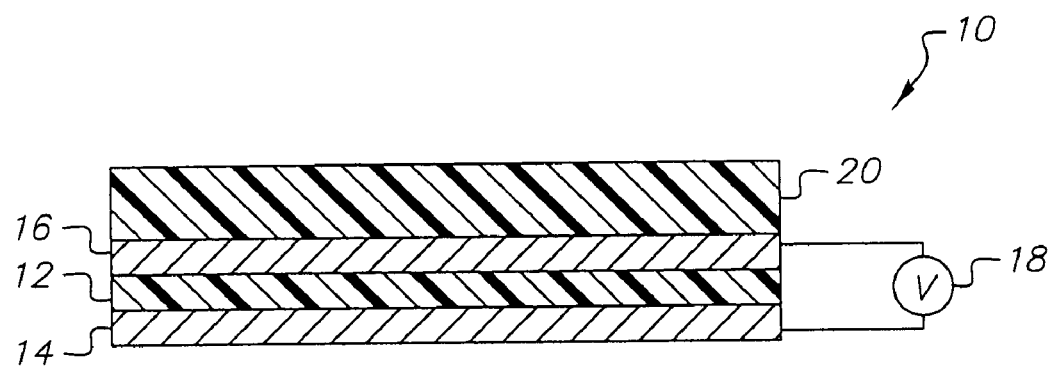
FIG. 1 illustrates a partial cross section of a prior art conventional OLED illumination device.

FIG. 1 is a schematic diagram of a prior art non-pixellated OLED light source including an organic light emitting layer 12 disposed between two electrodes, e.g. a cathode 14 and an anode 16. The organic light emitting layer 12 emits light upon application of a voltage from a power source 18 across the electrodes. The OLED light source 10 typically includes a substrate 20 such as glass or plastic. It will be understood that the relative locations of the anode 16 and cathode 14 may be reversed with respect to the substrate. The term OLED light source refers to the combination of the organic light emitting layer 12, the cathode 14, the anode 16, and other layers described below. As used herein the term "non-pixellated" means that the organic light emitting layer 12 is not divided into many small sub-sections or pixels that can be independently activated to form an image. It is contemplated however that the term non-pixellated includes light emitting layers that may be divided into a relatively small number of segments (e.g. fewer than 10) for purposes such as providing reliability, adjustable levels of illumination, or adjustable color output.

Figure 2:
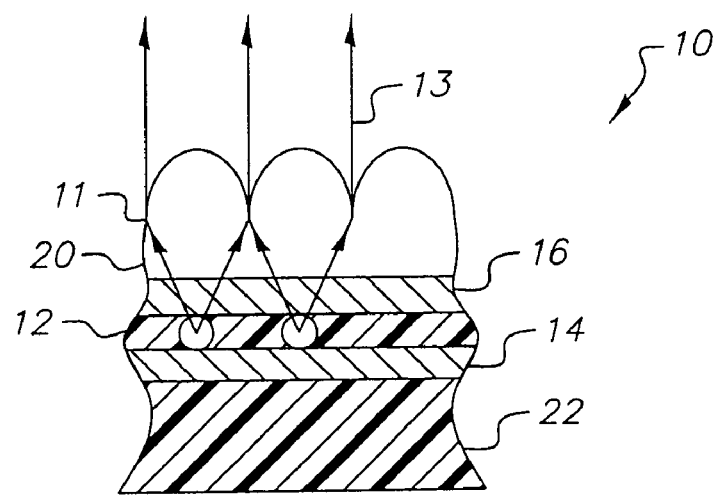
FIG. 2 is a partial cross section of a solid-state area illumination light source according to one embodiment of the present invention.

Referring to FIG. 2, a perspective view of a directed area illumination light source (e.g. a spotlight) according to one embodiment of the present invention is shown. The lighting source includes a non-pixellated OLED light source 10 of the type shown in FIG. 1 having a lenslet array 11, that directs the light 13 emitted from the light source. The lenslet array may also function as the substrate 20 (as shown) or cover 22. When power is supplied to the light source 10, it emits light uniformly from the entire OLED light emitting layer 12. The light is emitted in all directions from the light emitting layer 12. When the light passes through the lenslet array 11, it is concentrated in a desired direction.

Figure 3:
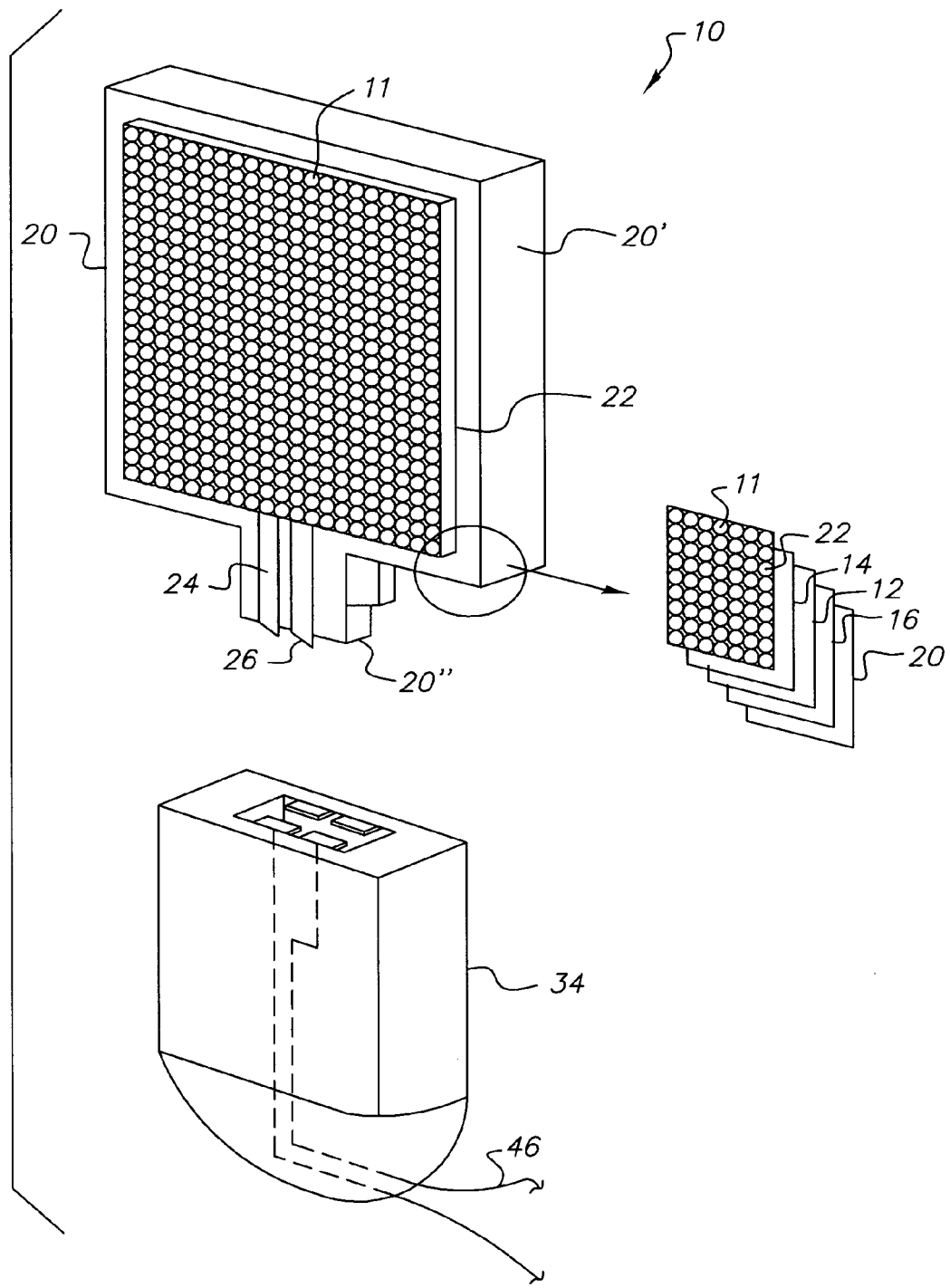
FIG. 3 is a perspective view of the light source shown in FIG. 2.

Referring to FIG. 3, according to one embodiment of the present invention, the light source 10, includes a substrate 20, the substrate defining a light emissive area portion 20' and an extension 20". An organic light emitting layer 12 is disposed between a cathode 14 and an anode 16. An encapsulating cover 22 is provided over the light source 10 on the body portion 20' of the substrate 20. To minimize cost of manufacture, assembly, and design and to maximize the robustness of the light source 10, according to the present invention, the materials are deposited as a single unitary coating onto a single unitary substrate 20.

The cover 22 may be a separate element such as a hermetically sealed cover plate affixed over the layers 12, 14, and 16 or the cover may be coated over the layers 12, 14, and 16 as an additional layer. The OLED light emitting layer 12 is continuous over the substrate to provide a continuous light emitting area. First and second conductors 24 and 26 located on the substrate 20 are electrically connected to the first and second electrodes 14 and 16, and extend beyond the encapsulating cover 22 on extension 20" for making electrical contact to the first and second electrodes by an external power source (not shown). This power source may be mounted in a portable apparatus that includes the light source 10 (as in a flashlight) or separately connected through a socket 34 to a power cable 46. The cable may be detachable from the light source or permanently affixed.

To allow light to be emitted from the OLED light source 10, the substrate 20, the electrodes 14 and 16, and the cover 22 are transparent. In applications where it is not required to emit light from both sides of the substrate, one or more of the substrate, cover, anode, or cathode may be opaque or reflective. The substrate 20 and/or cover 22 may be suitably treated to provide directional lighting in one direction only. For example, the cover, substrate, or one of the electrodes may be provided with a reflective surface so that light emitted by the OLED layer will travel through the other surface and the device will emit light from only one side.

Figure 4:
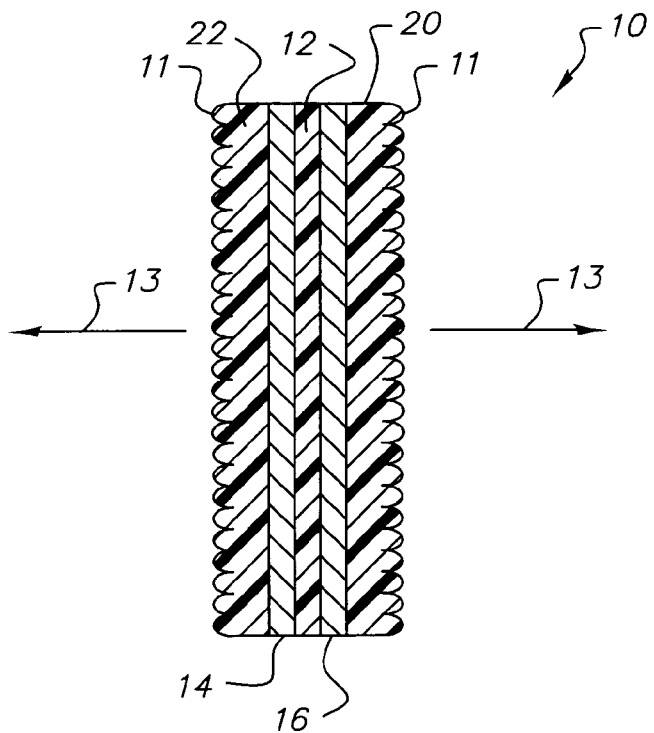
FIG. 4 is a cross sectional view of an area illumination light source according to the present invention that emits light through both a substrate and a cover.
Figure 5:
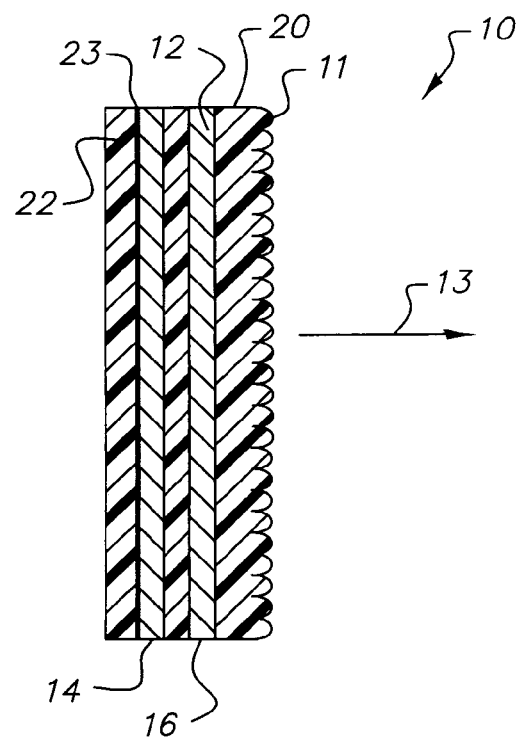
FIG. 5 is a cross sectional view of an area illumination light source according to the present invention that emits light through a substrate.
Figure 6:
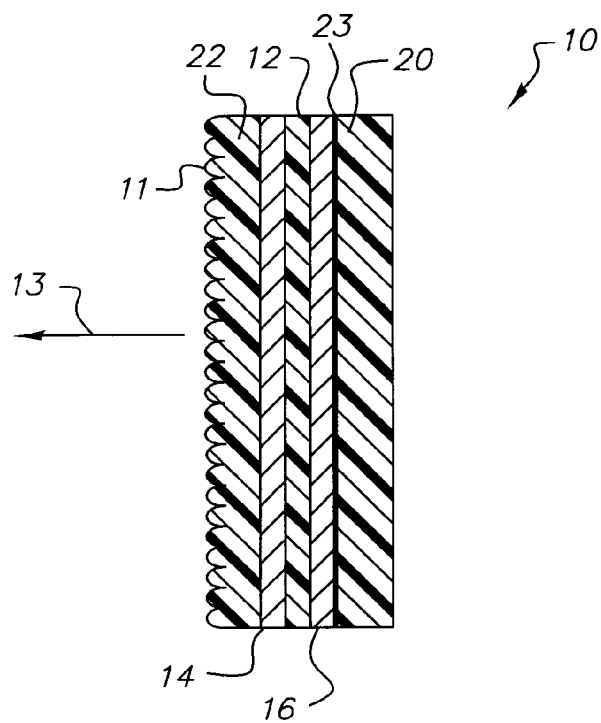
FIG. 6 is a cross sectional view of an area illumination light source according to the present invention that emits light through a cover.
Figure 7:
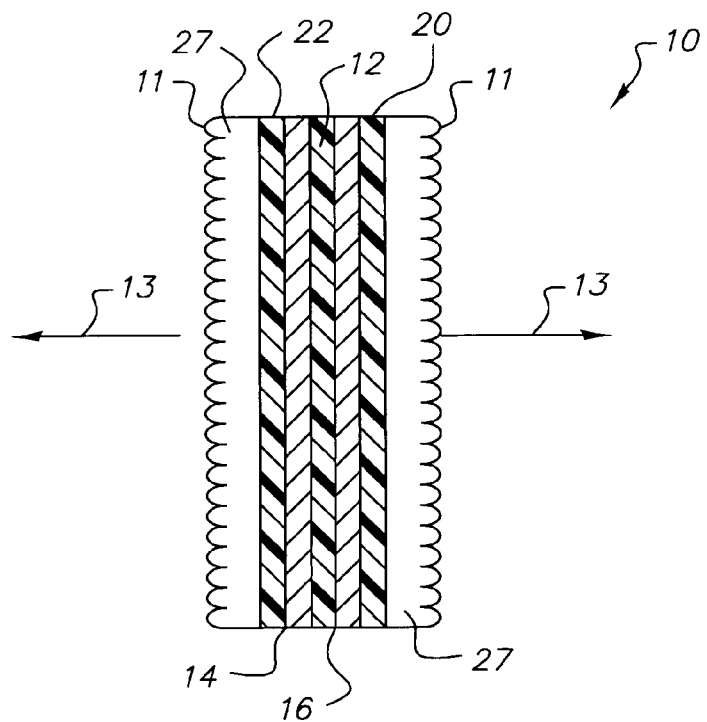
FIG. 7 is a cross sectional view of an area illumination light source according to an alternative embodiment of the present invention.

Referring to FIG. 4, in one embodiment, the light source 10 has no reflective layers and light 13 is emitted through both the encapsulating cover 22 and the substrate 20. Both the encapsulating cover 22 and the substrate 20 have an embossed or molded lenslet array 11. Referring to FIG. 5, in an alternative embodiment, the encapsulating cover 22 includes a reflective layer 23 and light 13 is directed through the substrate 20 which includes a lenslet array 11. Referring to FIG. 6, in a further alternative embodiment, the electrode deposited on the substrate 20 is reflective and light 13 is emitted through the encapsulating cover 22 which includes an embossed or molded lenslet array 11. Referring to FIG. 7, in a still further alternative embodiment, lenslet arrays 11 are provided by laminating a lenslet sheet 27 onto the encapsulating cover 22 and/or the substrate 20. The lenslet sheet may be attached using an index matching optical adhesive. In this case, the lenslet array is located farther away from the light emitting layer 12, and the focal length of the lenslets is adjusted accordingly to locate the focal points at the light emitting layer 12.

The lenslet array 11 may take a variety of forms depending on the application desired. In a preferred embodiment, the lenslet array is a flat layer embossed or molded on either or both the substrate 20 and/or the encapsulating cover 22. In one embodiment, the lenslet array is coextensive with the light emitting layer 12 of the device. For example, a multiplicity of separate lenses may be embossed or molded into the cover and/or the substrate. In an alternative embodiment, the lenslets are embossed into a separate layer, for example a plastic sheet, which is applied to the substrate and/or encapsulating cover over the light emitting area. The lenslets may be identical across the array or elements at the edge may differ from those in the center to further direct the light in a preferred way.

Figure 8:
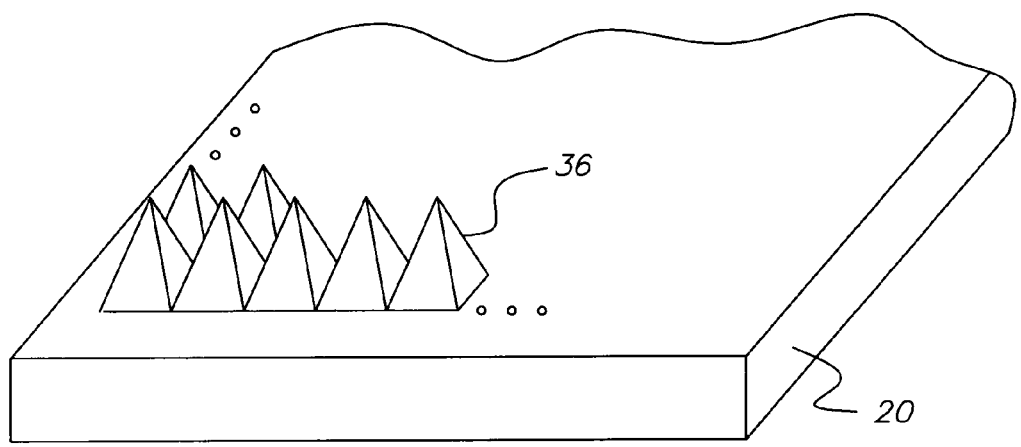
FIG. 8 is a partial perspective view of a lenslet array having pyramidal lenslets useful with the present invention.
Figure 9:
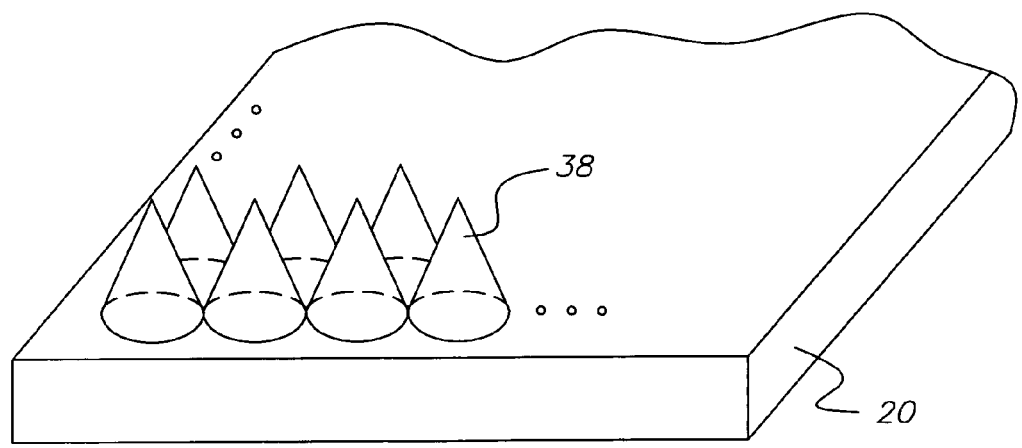
FIG. 9 is a partial perspective view of a lenslet array having conical lenslets useful with the present invention.

As a general rule, the focal length of a short focal length lens is on the order of its diameter. In the present invention, the lenslet array(s) is applied directly to the substrate and/or cover of the light emitters. In an OLED lamp, this distance can be as small as a millimeter. The lenslet arrays should have a similar focal length and be as small as possible, a millimeter or less. The shape of the lenslet arrays can vary depending on the desired application, for example conventional convex lenses, pyramids 36 (as shown in FIG. 8), and cones 38 (as shown in FIG. 9).

Because both the lenslet arrays 11 and the OLED light source 10 are flat, the present invention enables a very flat area illumination light source that directs light in a preferred way.

The substrate 20 can be either rigid or flexible. Rigid substrates, such as glass, provide more structural strength and are generally planar and may have a variety of shapes other than rectangular. The present invention may also be used with a flexible substrate, such as plastic. If a flexible substrate is used, the flexible transparent substrate may be attached to a rigid support or held within a frame. The frame may be opaque or transparent depending on the lighting and decorating needs of the application.

The present invention may be powered by a variety of sources, for example from standard AC power (such as 110 volts AC or 220 volts AC) available in households or offices. If necessary, conventional power conversion devices may be employed to provide power suitable for used by the light emitting layer 12. Alternatively, DC sources found in vehicles or through batteries may be used, for example 24, 12, or 6 volt DC sources with appropriate converters to obtain a desired operating voltage and waveform.

The present invention has the added advantage that the directed light source has a compact planar configuration enabling efficient storage, packing, and shipping.

In a preferred embodiment, the invention is employed in an area illumination device that includes an Organic Light Emitting Diode (OLED) which is composed of small molecule or polymeric OLED materials as disclosed in but not limited to U.S. Pat. No. 4,769,292, issued Sep. 6, 1988 to Tang et al., and U.S. Pat. No. 5,061,569, issued Oct. 29, 1991 to VanSlyke et al. The light source may also include multiple light emitting layers as described in commonly assigned U.S. patent application Ser. No. 10/231,853 filed Aug. 7, 2002 by Tyan now U.S. Pat. No. 6,693,296), and U.S. Ser. No. 10/077,270 filed Feb. 15, 2002 by Liao et al., the disclosures of which are incorporated herein by reference.

The invention has been described in detail with particular reference to certain preferred embodiments thereof, but it

| PARTS LIST | |
|---|---|
| 10 | OLED light source |
| 11 | lenslet array |
| 12 | organic light emitting layer |
| 13 | directed light |
| 14 | cathode |
| 16 | anode |
| 18 | power source |
| 20 | substrate |
| 20' | light emissive portion of substrate |
| 20" | extension of substrate |
| 22 | encapsulating cover |
| 23 | reflective layer |
| 24 | first conductor |
| 26 | second conductor |
| 27 | sheet having lenslet array |
| 34 | socket |
| 36 | pyramidal lenslet |
| 38 | conical lenslet |
| 46 | power cable |

What is claimed is:

1. A solid-state area illumination light source, comprising:
   a) a planar substrate,
   b) a non-pixellated organic light emitting diode (OLED) layer deposited on the planar substrate, the organic light emitting diode layer including first and second electrodes for providing electrical power to the OLED layer,
   c) an encapsulating cover covering the OLED layer;
   d) first and second conductors electrically connected to the first and second electrodes, and extending beyond the encapsulating cover for making electrical contact to the first and second electrodes by an external power source; and
   e) a lenslet array located on the encapsulating cover and coextensive with the OLED layer for directing the light emitted by the OLED layer, wherein the encapsulating cover is transparent, and light is emitted from the OLED layer through the encapsulating cover.

2. The solid-state light source claimed in claim 1, wherein the lenslet array is formed in the encapsulating cover.

3. The solid-state light source claimed in claim 1, wherein the lenslet array is attached to the encapsulating cover by an optical adhesive.

4. The light source claimed in claim 1, wherein the substrate is a rigid planar substrate.

5. The light source claimed in claim 1, wherein the substrate is flexible.

6. The light source claimed in claim 5, further comprising a support for holding the substrate in a plane.

7. The lighting apparatus claimed in claim 1, wherein the lenslet array is embossed.

8. The lighting apparatus claimed in claim 1, wherein the lenslet array is molded.

9. The light source claimed in claim 1, wherein the cover is a hermetically sealed cover plate.

10. The light source claimed in claim 1, wherein the cover is a coated layer.

11. The lighting apparatus claimed in claim 1, wherein the light source operates on standard power.

12. The lighting apparatus claimed in claim 1, wherein the planar substrate is transparent.

13. The lighting apparatus claimed in claim 1, wherein the planar substrate is transparent, and light is emitted from the OLED layer through the encapsulating cover and through the planar substrate.

14. The lighting apparatus claimed in claim 1, wherein the OLED layer emits light through the encapsulating cover and further includes a reflective layer between the light emitter and the substrate.

15. The light source claimed in claim 13,
    wherein a lenslet array is located on each of the substrate and the cover.

16. The light source claimed in claim 1, wherein the lenslets are hemispheres.

17. The light source claimed in claim 1, wherein the lenslets are pyramids.

18. The light source claimed in claim 1, wherein the lenslets are cones.

19. The light source claimed in claim 1, wherein the lenslets are fresnel lenslets.

20. The light source claimed in claim 1, wherein the lenslets have a focal length less than 1 mm, and are arranged such that their focal point is located at the light emitting layer.

* * * * *